(12) United States Patent
Miller et al.

(10) Patent No.: US 6,320,178 B1
(45) Date of Patent: Nov. 20, 2001

(54) OPTOELECTRONIC COMPONENT ARRANGEMENT

(75) Inventors: Stephan Miller, Vachendorf; Elmar Mayer, Tacherting/Reit, both of (DE)

(73) Assignee: Die Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 09/264,266

(22) Filed: Mar. 8, 1999

(30) Foreign Application Priority Data

Mar. 19, 1998 (DE) .............................................. 198 12 008

(51) Int. Cl.⁷ ...................... H01L 31/0232; H01L 23/14; G01B 11/00
(52) U.S. Cl. ................... 250/214 R; 250/214 C; 257/431
(58) Field of Search ........................... 250/214 R, 214 C; 237/431, 432, 433, 434, 435, 436, 437

(56) References Cited

U.S. PATENT DOCUMENTS

| 5,405,809 | 4/1995 | Nakamura et al. . |
| 5,483,060 | 1/1996 | Sugiura et al. . |
| 5,670,781 | 9/1997 | Setbacken . |
| 5,682,066 | 10/1997 | Gamota et al. . |

FOREIGN PATENT DOCUMENTS

| 35 12 958 | 11/1985 | (DE) . |
| 43 27 133 | 2/1995 | (DE) . |
| 197 52 511 | 6/1998 | (DE) . |
| 0 502 340 | 9/1992 | (EP) . |
| 0 681 334 | 11/1995 | (EP) . |
| 0 734 074 | 9/1996 | (EP) . |

OTHER PUBLICATIONS

P. Seitz, "Image Sensing With Maximum Sensitivity Using Industrial CMOS Technology," SPIE, vol. 3099, 1997, pp. 22–33.

Primary Examiner—F. L. Evans
(74) Attorney, Agent, or Firm—Kenyon & Kenyon

(57) ABSTRACT

An optoelectronic component arrangement is indicated, which includes a radiation-sensitive detector element having a semiconductor base substrate with one or more doped partial regions and at least one partial layer which is arranged directly in front of the semiconductor base substrate. The detector element is arranged on a transparent carrier substrate, and a filling material is arranged between the carrier substrate and the surface of the detector element facing the carrier substrate. All materials arranged in front of the semiconductor base substrate and the doped partial regions have an essentially similar index of refraction.

14 Claims, 3 Drawing Sheets

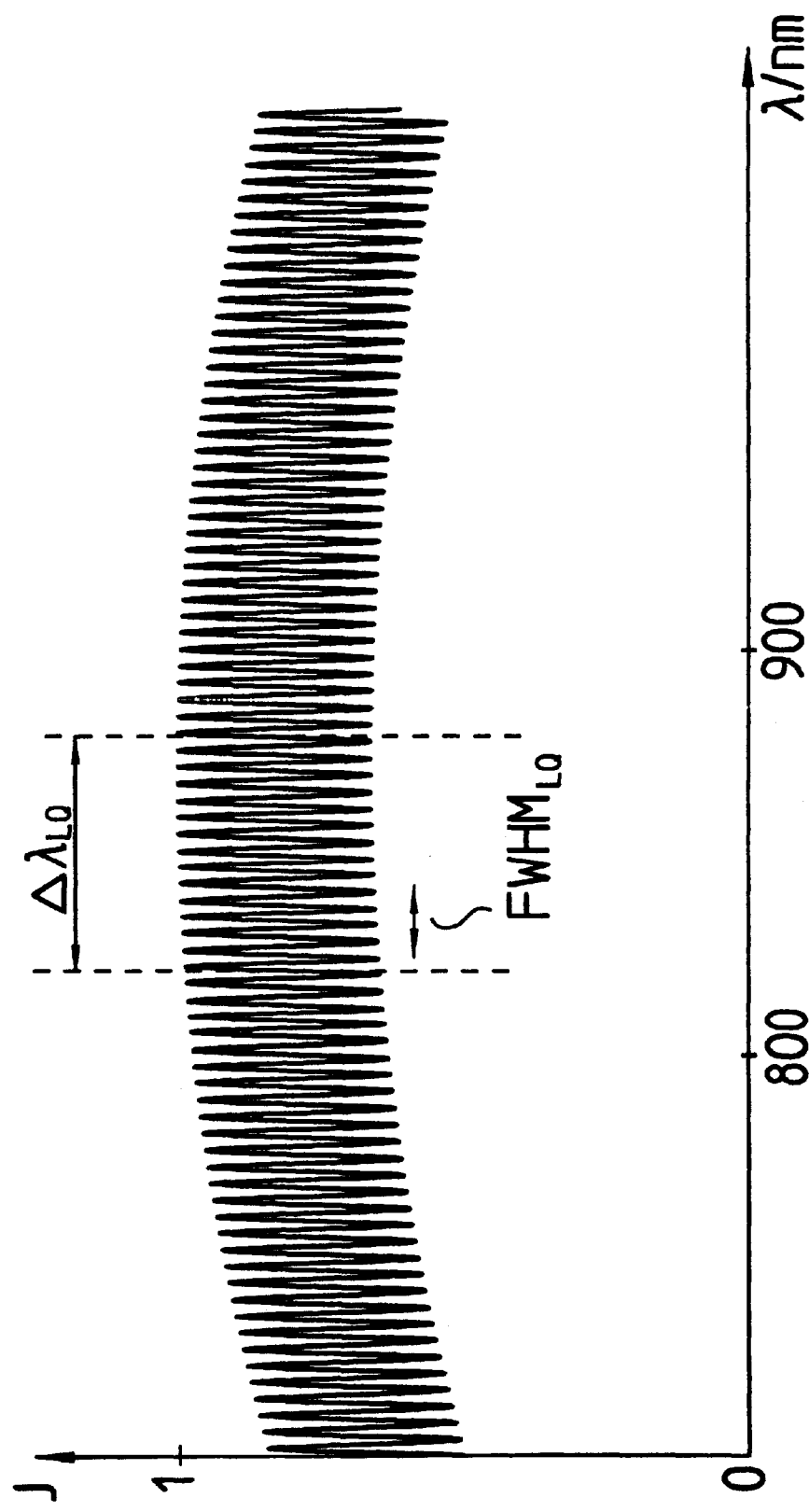

OPTOELECTRONIC COMPONENT ARRANGEMENT

FIELD OF THE INVENTION

The present invention relates to an optoelectronic component arrangement which includes a radiation-sensitive detector element arranged on a carrier substrate.

BACKGROUND INFORMATION

U.S. Pat. No. 5,670,781 discloses arranging, for example in the scanning unit of an optical position measuring device, a radiation-sensitive, optoelectronic detector element on a glass carrier substrate using so-called "flip-chip" or "chip-on-glass" technology. This provides certain advantages, particularly with respect to the contacting of the detector element, since one can eliminate the need, for instance, for filigreed bonding wires, which are otherwise required for the contacting.

So-called CMOS photoelements, for instance, are considered as suitable detector elements for an arrangement of this kind. These types of photoelements exhibit certain properties which have proven to be disadvantageous in high-precision measuring system applications. The publication, "Image Sensing With Maximum Sensitivity Using Industrial CMOS Technology" by P. Seitz in SPIE vol. 3099, 1997; pp. 22–33, discloses, for example, that the sensitivity of CMOS photoelements depends substantially on the detected radiation wavelength and the CMOS photoelements exhibit wavelength-dependent oscillations. A graphic representation of this relation is shown in FIG. 1, which illustrates the detected radiation intensity as a function of the radiation wavelength when working with components of this kind. In the measuring operation of a scanning unit of an optical positional measuring system, it cannot always be avoided that the particular light source being used has a fluctuating emitted radiation wavelength. Besides the bandwidth or half-value width $FWHM_{LQ}$ of the light source being used, FIG. 1 also indicates the fluctuation range $\Delta\lambda_{LQ}$ of the emitted wavelength of this light source. Fluctuations of this kind in the emitted wavelength $\lambda_{LQ}$ of the light source are attributed, for example, to temperature variations. Accordingly, the result is an insufficiently stable response characteristic in an optoelectronic detector element of this kind that is especially not stable enough in the case of a detection wavelength that may vary as a function of temperature.

U.S. Pat. No. 5,483,060 discloses arranging a CMOS detector element using "flip-chip" technology on a glass carrier substrate. However, in the depicted arrangement, the problems discussed above likewise arise with respect to the wavelength-dependent response characteristic of these detector elements.

In conjunction with the arrangement of optoelectronic components on a glass carrier substrate, reference is also made to U.S. Pat. No. 5,682,066. This patent discloses arranging a special filling material between an LED and the glass carrier substrate. A filling material is selected whose constituents have refractive indices identical to those of the carrier substrate. however, merely selecting a filling material of this kind does not solve the problems addressed above when a CMOS photoelement is to be arranged on a carrier substrate.

SUMMARY OF THE INVENTION

An object of the present invention is, therefore, to devise an optoelectronic component arrangement that is particularly suited for a scanning unit of an optical position measuring device, which will enable a radiation-sensitive detector element to be easily arranged on a carrier substrate, without entailing substantial contacting complexity, and, at the same time, while ensuring a substantially wavelength-independent response characteristic of the detector element.

The present invention provides an optoelectronic component arrangement comprised of a radiation-sensitive detector element (1) having a semiconductor base substrate (1.2), into which one or more doped partial regions (1.3) are introduced and having at least one partial layer (1.1), which is arranged to adjoin the semiconductor base substrate (1.2). The detector element (1) is arranged on a transparent carrier substrate (2), and a filling material (7) is arranged between the carrier substrate (2) and the surface (3) of the detector element (1) facing the carrier substrate (2). All materials, which, in the direction of the carrier substrate (2), are arranged in front of the semiconductor base substrate (1.2) and the doped partial regions (1.3), have an essentially similar index of refraction (n).

Advantageous specific embodiments of the optoelectronic component arrangement according to the present invention include that: (a) the filling material (7), as well as the material of the carrier substrate (2), have an index of refraction (n), which is essentially similar to the index of refraction (n) of that partial layer (1.1), which is arranged to directly adjoin the semiconductor base substrate (1.2); (b) the detector element (1) in front of the semiconductor base substrate (1.2) has merely a partial layer (1.1) or a layer system of silicon dioxide, to which both the index of refraction (n) of the filling material (7) as well as of the carrier substrate (2) are adapted; (c) the detector element (1) is designed as a CMOS photoelement; (d) the detector element (1) is applied to the carrier substrate (2) using flip-chip contacting technology; (e) the carrier substrate (2) is made of glass; and/or (f) the index of refraction (n) is between 1.45 and 1.55.

The present invention also provides a use of an optoelectronic component arrangement of the present invention in the scanning unit of an optical position measuring device.

The various measures of the present invention ensure that the response characteristic of optoelectronic detector elements, as well, such as of CMOS photoelements, is clearly less dependent on wavelength than in disclosed methods heretofore. This means, in turn, that component arrangements according to the present invention can also be used in scanning units of optical position measuring devices, even when it is not always ensured that the wavelength emitted by the radiation source in question remains stable.

Additional advantages of the optoelectronic component arrangement according to the present invention are evident in the simple assembly required for component arrangements of this kind; thus, the detector elements provided can be arranged on carrier substrates using the known "flip-chip" technology. In this context, the contacting of the detector elements can take place, for example, via so-called "metal bumps" or "solder bumps", or by using a suitable adhesive-type contacting. This enables one, in particular, to avoid expensive contacts using filigreed bonding wires.

Besides the benefit of simple contacts, one achieves the advantage of being able to have an extremely compact design for these kinds of component arrangements; in applications in scanning units of optical position measuring devices, one can realize extremely small dimensions for measuring systems of this kind.

BRIEF DESCRIPTION OF THE DRAWINGS

Further advantages derived from and details pertaining to the present invention are revealed with reference to:

FIG. 3 shows a representation of the wavelength dependency of the response characteristic of an optoelectronic detector element within the optoelectronic component arrangement according to the present invention.

DETAILED DESCRIPTION

An exemplary embodiment of the optoelectronic component arrangement according to the present invention is elucidated in the following on the basis of FIG. 2. A component arrangement of this kind can be used, for example, in scanning units of optical position measuring devices. These are employed in the optical scanning of scale graduations to produce positionally dependent signals indicative of the relative positions of two parts which are movable in relation to one another.

Figure 2:
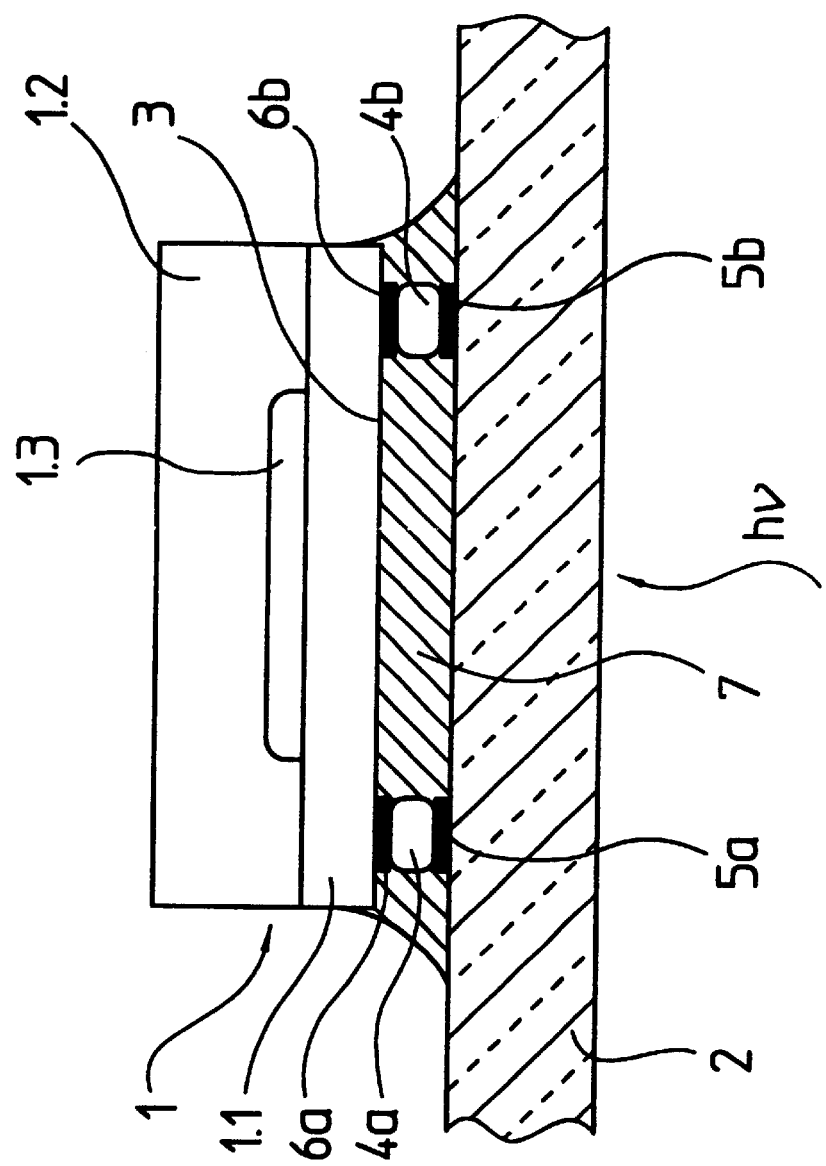
FIG. 2 shows a cross-section through an exemplary embodiment of the optoelectronic component arrangement of the present invention.

FIG. 2 shows a schematic cross-sectional representation of a radiation-sensitive optoelectronic detector element 1, which is arranged on a carrier substrate 2 one that is transparent to the radiation wavelength used. In this context, radiation-sensitive surface 3 of detector element 1 faces transparent carrier substrate 2, the direction of incidence of the radiation to be detected is indicated by the arrow having reference symbol hυ. Electrically conductive connections between contacting regions 6a, 6b of detector element 1 and electrical circuit traces 5a, 5b on carrier substrate 1 are produced using known flip-chip connection technology. For this, contacting regions 6a, 6b or bonding pads of detector element 1, and circuit traces 5a, 5b on carrier substrate 2 are conductively interconnected via suitable contacting elements 4a, 4b or contacting materials. For this purpose, one can use the most widely varying contacting elements 4a, 4b or contacting materials. It is possible, for example, to provide so-called "solder bumps" as contacting elements 4a, 4b. Also possible at this location is the use of a suitable, electrically conductive adhesive or conductive gel. By using a suitable adhesive at this location, high temperatures, which would otherwise be necessitated by the soldering process, can be advantageously avoided at these locations. Moreover, using adhesives of this kind enables one to reduce the distance between radiation-sensitive surface 3 of detector element 1 and carrier substrate 2, since in this type of contacting, contacting elements 4a, 4b that result are not as voluminous as the "solder bumps".

In the scanning unit of an optical position measuring device, detector element 1 can be connected to subsequent evaluation elements, in the manner explained. These evaluation elements, for example, are likewise arranged on carrier substrate 2 and assume the function of a further processing of the detected scanning signals.

Also introduced between radiation-sensitive surface 3 of detector element 1 and carrier substrate 1 is a filling material 7, i.e., a so-called "underfill", which is likewise transparent to the radiation wavelength being used. In this context, filling material 7 is used, inter alia, as a moderator to compensate for mechanical stresses that can occur between detector element 1 and carrier substrate 2. These stresses are caused by the different thermal expansion coefficients of the contiguous materials. In this manner, the service life of the entire component arrangement can be prolonged. In the case that "solder bumps" are used as contacting elements 4a, 4b, filler material 7 in question, in addition to the mentioned "moderator function", also assumes a protective function for solder bumps 4a, 4b.

Except for the modifications to be elucidated in the following, the merely schematically depicted detector element 1 is designed as a known CMOS photo element and includes various partial layers 1.1, 1.2 or partial regions 1.3. The various partial layers 1.1, 1.2 or partial regions 1.3 partly include different semiconductor materials with, in some instances, different doping; besides the mentioned semiconductor materials, in addition, other very diverse materials can also be used. Except for the modifications to be elucidated in the following, CMOS photodiodes of this kind are commercially available, for example, from the firm *ORBIT Semiconductor Inc.*, Sunnyvale, U.S.A.

The first partial layer 1.1 in the depicted exemplary embodiment is, for instance, a layer system that includes a plurality of individual layers of silicon dioxide $SiO_2$, which are used as gate oxides or capacitors and may also be doped accordingly. In this exemplary embodiment, another partial layer 1.2 is formed by the semiconductor base substrate of silicon, in that various highly doped partial regions are introduced, of which merely a single partial region 1.3 is shown schematically. Disposed in partial layer 1.2, in the region of the boundary surface between the Si semiconductor base substrate and the highly doped partial region 1.3, is the actual active region of detector element 1, where signals are ultimately produced. The known method of producing signals in CMOS photoelements will not be further discussed at this point; reference is merely made, for example, in this regard to the textbook "Semiconductor Devices", Sze S. M., J. Wiley & Sons, 1985, pp. 279–287, which is hereby incorporated by reference herein.

As already mentioned, CMOS photoelements of such a design are usually fundamentally known, commercially available CMOS photoelements having one or more passivation or protection layers in front of partial layer 1.1 having radiation-sensitive surface 3. In other words, the passivation or protection layers are predeposited on a front surface (in FIG. 2, the bottom surface) of partial layer 1.1. In this context, silicon nitride layers ($Si_3N_4$) and/or oxinitride layers ($Si_3N_4+SiO_2$) are provided as passivation layers. At this point, the present invention provides for removing these passivation layers of the CMOS photodiode or for not applying them at all, since it has been recognized within the scope of the present invention that the pronounced wavelength dependency of the response characteristic of these elements is considerably influenced by the various refractive indices in those partial layers which border on the semiconductor base substrate of silicon in the direction of radiation-sensitive surface 3. The above mentioned, usually used passivation layers arranged in this region have, in particular, refractive indices of between $n \approx 2.0$ and $n \approx 1.7$, while partial layer 1.1 has a refractive index of about $n \approx 1.45$. Radiation-sensitive surface 3 of the CMOS photoelement, which faces carrier substrate 2, is accordingly formed in the depicted exemplary embodiment directly by first partial layer 1.1 of the photoelement, which has a refractive index of n≈1.45.

As a further measure according to the present invention for avoiding the pronounced wavelength dependency in the response characteristic of detector elements of this kind, in the regions of the component arrangement bordering on detector element 1 or on its radiation-sensitive surface 3, it is provided to also select materials which have a refractive index n and which deviate as little as possible from refractive index n of that partial layer 1.1 of detector element 1, which is arranged to directly adjoin semiconductor base substrate 1.2 of silicon and doped partial regions 1.3. Thus, in the case of the CMOS photoelement, it proves to be advantageous to use the so-called Borofloat® glass having a refractive index of n≈1.47 that is available from the firm Schott Glaswerke, Mainz, Germany as the material for carrier substrate 2.

It is equally provided in accordance with the present invention to properly select the filling material 7 used between detector element 1 and carrier substrate 2, i,e., in particular to select a filling material 7, whose refractive index n likewise does not deviate substantially from refractive index n of partial layer 1.1, which is arranged directly in front of semiconductor base substrate 1.2 and doped partial regions 1.3 introduced therein. Suited for this purpose in the illustrated exemplary embodiment is, for instance, filling material 7 having the product description Vitralit 1505, which is sold by the firm Panacol-Elosol GmbH, Oberursel, Germany; this filling material 7 has a refractive index of n≈1.52.

It was thus recognized that by adapting, in accordance with the present invention, the refractive indices of materials of this kind, which are arranged in front of the semiconductor base substrate 1.2 of silicon and the doped partial regions 1.3 introduced therein, one can achieve a clearly optimized response performance for the detector elements, particularly when CMOS photoelements are used. In one advantageous specific embodiment, the corresponding refractive indices n lie, for instance, between 1.45 and 1.55.

Figure 1:
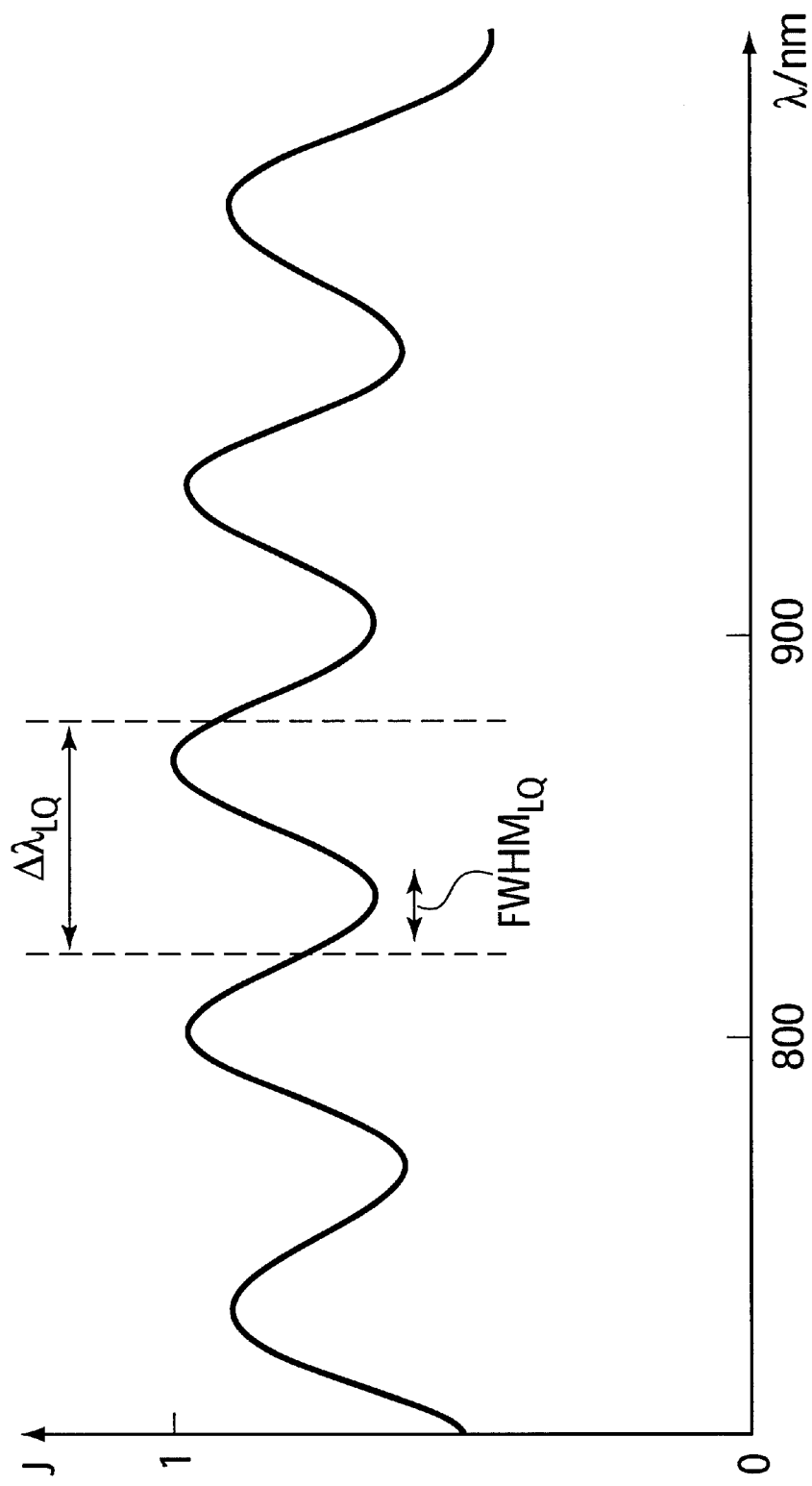
FIG. 1 shows a representation of the wavelength dependency of the response characteristic of an optoelectronic detector element within an optoelectronic component arrangement according to the arrangement described above in the Background Information section.

A graphic representation of the response performance, optimized in this manner, is shown in FIG. 3. Clearly evident in the registered signal intensity in this case are the significantly more frequent wavelength-dependent oscillations per wavelength interval. If at this point, for example, the emitted radiation wavelength of the light source fluctuates in the indicated range $\Delta\lambda_{LQ}$, then this has clearly less effect on the registered intensity in comparison to the previous state, as was clarified on the basis of FIG. 1. This is due to the fact that, at this point, in this fluctuation range, $\Delta\lambda_{LQ}$ is averaged over the multitude of wavelength-dependent oscillations in the detection process. Furthermore, analogously to FIG. 1, the bandwidth $FWHM_{LQ}$ of the light source used is sketched in FIG. 3.

Other alternatives are possible, of course, besides the elucidated materials, of course, provided that the requirements in accordance with the present invention with respect to the refractive index are fulfilled.

It should be mentioned here that it can be advantageous, for instance, for an antireflective coating to be applied to the side of carrier substrate 2 and to face away from the detector element. Applying a coating of this kind does not have a negative effect on the response performance of detector element 1.

Alternatively, it would also be fundamentally possible, of course, to provide suitable passivation layers in front of radiation-sensitive surface 3 of detector element 1, which are better adapted, in terms of the refractive index, to partial layer 1.1 or to carrier substrate 2, than are the passivation layers of conventional CMOS photoelements discussed above.

Moreover, it is also pointed out that, in particular, when the optoelectronic component arrangement according to the present invention is used in the scanning unit of an optical position measuring device, very diverse design variants are possible. Thus, for example, a scanning graduation can also be arranged on one side of carrier substrate 2 in front of radiation-sensitive surface 3 of detector element 1. In the same way, it can also be provided to apply a suitable encapsulant as additional protection for the arrangement on the rear side of detector element 1.

What is claimed is:

1. An optoelectronic component arrangement comprising:
    a radiation-sensitive detector element having a semiconductor base substrate with at least one doped partial region and having at least one partial layer adjoining the semiconductor base substrate;
    a transparent carrier substrate, the detector element being arranged on the transparent carrier substrate; and
    a filling material between the carrier substrate and a surface of the detector element facing the carrier substrate;
    all materials in front of the at least one doped partial region in a direction of the carrier substrate having an essentially similar index of refraction.

2. The optoelectronic component arrangement as recited in claim 1 wherein the all materials include the at least one partial layer, the filling material and the transparent carrier substrate, the at least one partial layer directly adjoining the semiconductor base substrate.

3. The optoelectronic component arrangement as recited in claim 2 wherein the at least one partial layer is a single partial layer or a layer system of silicon dioxide.

4. The optoelectronic component arrangement as recited in claim 1 wherein the detector element is a CMOS photoelement.

5. The optoelectronic component arrangement as recited in claim 1 wherein the detector element is connected to the carrier substrate through flip-chip contacting.

6. The optoelectronic component arrangement as recited in claim 1 wherein the carrier substrate is made of glass.

7. The optoelectronic component arrangement as recited in claim 1 wherein the index of refraction is between 1.45 and 1.55.

8. A scanning unit of an optical position measuring device comprising:
    a radiation-sensitive detector element having a semiconductor base substrate with at least one doped partial region and having at least one partial layer adjoining the semiconductor base substrate;
    a transparent carrier substrate, the detector element being arranged on the transparent carrier substrate; and a filling material between the carrier substrate and a surface of the detector element facing the carrier substrate;

all materials in front of the at least one doped partial region in a direction of the carrier substrate having an essentially similar index of refraction.

9. An optoelectronic component arrangement comprising:

a semiconductor base substrate with at least one doped partial region at a first surface for detecting radiation;

at least one partial layer adjoining the first surface;

a transparent carrier substrate, the at least one partial layer being arranged on the transparent carrier substrate; and a filling material between the carrier substrate and the at least one partial layer;

the at least one partial layer, the filling material and the carrier substrate having an essentially similar index of refraction so that at least part of the radiation passing to the base substrate experiences solely the similar index of refraction.

10. The optoelectronic component arrangement as recited in claim 9 wherein the at least one partial layer is a single partial layer or a layer system of silicon dioxide.

11. The optoelectronic component arrangement as recited in claim 9 wherein the base substrate and the at least one partial layer form a CMOS photoelement.

12. The optoelectronic component arrangement as recited in claim 9 wherein the at least one partial layer is connected to the carrier substrate through flip-chip contacting.

13. The optoelectronic component arrangement as recited in claim 9 wherein the carrier substrate is made of glass.

14. The optoelectronic component arrangement as recited in claim 9 wherein the similar index of refraction is between 1.45 and 1.55.

* * * * *